(12) United States Patent
Guo et al.

(10) Patent No.: US 10,566,505 B2
(45) Date of Patent: Feb. 18, 2020

(54) LIGHT-EMITTING DIODE, BACKLIGHT MODULE, AND LIQUID CRYSTAL DISPLAY DEVICE

(71) Applicant: BOE TECHNOLOGY GROUP CO., LTD., Beijing (CN)

(72) Inventors: Kang Guo, Beijing (CN); Xin Gu, Beijing (CN); Wei Xu, Beijing (CN); Xiao Zhang, Beijing (CN); Zhen Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/979,818

(22) Filed: May 15, 2018

(65) Prior Publication Data
US 2019/0097099 A1     Mar. 28, 2019

(30) Foreign Application Priority Data
Sep. 26, 2017 (CN) .......................... 2017 1 0884068

(51) Int. Cl.
*H01L 33/50* (2010.01)
*H01L 33/40* (2010.01)
(Continued)

(52) U.S. Cl.
CPC ........ *H01L 33/505* (2013.01); *G02F 1/13362* (2013.01); *G02F 1/133603* (2013.01);
(Continued)

(58) Field of Classification Search
CPC ..... H01L 35/505; H01L 35/405; H01L 33/44; H01L 33/504; G02F 1/133603; G02F 1/13362; G02F 1/133621
See application file for complete search history.

(56) References Cited

U.S. PATENT DOCUMENTS

| 10,324,258 | B2 * | 6/2019 | Li ........................... G02B 6/124 |
| 2003/0058386 | A1 * | 3/2003 | Bastiaansen ......... G02B 6/0053 349/100 |

(Continued)

FOREIGN PATENT DOCUMENTS

| CN | 101079463 A | 11/2007 |
| CN | 201112409 Y | 9/2008 |

(Continued)

OTHER PUBLICATIONS

First Office Action for Chinese Patent Application No. 201710884068.4 dated Nov. 26, 2019.

*Primary Examiner* — Zandra V Smith
*Assistant Examiner* — Andre C Stevenson
(74) *Attorney, Agent, or Firm* — Calfee, Halter & Griswold LLP

(57) ABSTRACT

The present disclosure relates to a light-emitting diode (LED), including: a grating layer; and a light reflecting layer, wherein a light-emitting component is disposed between the grating layer and the light reflecting layer; and wherein the grating layer is configured to let linearly polarized light perpendicular to a grating direction of the grating layer in light emitted from the light-emitting component transmit through the grating layer, and reflect linearly polarized light parallel to the grating direction of the grating layer in the light emitted from the light-emitting component.

13 Claims, 3 Drawing Sheets

(51) Int. Cl.
*G02F 1/1335* (2006.01)
*H01L 33/44* (2010.01)
*H01L 33/32* (2010.01)
*H01L 33/06* (2010.01)

(52) U.S. Cl.
CPC ...... *G02F 1/133621* (2013.01); *H01L 33/405* (2013.01); *G02F 2001/133614* (2013.01); *G02F 2201/30* (2013.01); *G02F 2202/108* (2013.01); *H01L 33/06* (2013.01); *H01L 33/32* (2013.01); *H01L 33/44* (2013.01); *H01L 33/504* (2013.01); *H01L 2933/0083* (2013.01)

(56) References Cited

U.S. PATENT DOCUMENTS

| | | | | |
|---|---|---|---|---|
| 2010/0316083 | A1* | 12/2010 | Chang-Hasnain ... | G02B 5/0816 372/50.11 |
| 2012/0034622 | A1* | 2/2012 | Ignatius ........... | B82Y 5/00 435/7.2 |
| 2015/0085891 | A1* | 3/2015 | Watanabe ........... | H01S 5/141 372/50.11 |
| 2016/0327906 | A1* | 11/2016 | Futterer ........... | G02F 1/133553 |

FOREIGN PATENT DOCUMENTS

| | | |
|---|---|---|
| CN | 101354458 A | 1/2009 |
| CN | 101499511 A | 8/2009 |
| CN | 101752472 A | 6/2010 |
| CN | 101807653 A | 8/2010 |
| CN | 101853912 A | 10/2010 |
| CN | 102117771 A | 7/2011 |
| CN | 102263179 A | 11/2011 |
| CN | 102969428 A | 3/2013 |
| CN | 103323901 A | 9/2013 |
| CN | 103969729 A | 8/2014 |
| CN | 105954932 A | 9/2016 |
| CN | 106684109 A | 5/2017 |
| CN | 106950636 A | 7/2017 |
| WO | 2005089098 A2 | 9/2005 |

* cited by examiner

LIGHT-EMITTING DIODE, BACKLIGHT MODULE, AND LIQUID CRYSTAL DISPLAY DEVICE

CROSS-REFERENCE TO RELATED APPLICATIONS

This application is based on and claims priority to Chinese Patent Application No. 201710884068.4, filed on Sep. 26, 2017, the entire contents thereof are incorporated herein by reference.

TECHNICAL FIELD

The present disclosure relates to the field of polarization light-emitting device, particularly to a light-emitting diode (LED), a backlight module and a liquid crystal display (LCD) device.

BACKGROUND

Polarization LED is a kind of light source capable of self-emitting polarized light. The polarization LED may be manufactured by non-polar surface or semi-polar surface GaN film growth on a substrate, so as to form a polarization light-emitting source capable of emitting polarized light, which possesses considerable application values in fields such as communication and image formation.

Taking a liquid crystal (LC) backlight source as an example, in order to simplify a structure of a traditional dual-polaroid LCD device, an existing technology adopts a solution in which a polarization LED backlight source capable of directly emitting polarized light is used as the LC backlight source of the LCD device. This reduces a volume of the LCD device.

However, such polarization LED obtained by using non-polar surface or semi-polar surface GaN film growth on a substrate also involves problem of poor illuminous efficiency, resulting in high power consumption of electric equipment.

SUMMARY

The present disclosure provides a light-emitting diode (LED), a backlight module and a LCD device, mainly aiming to provide a new type of polarization LED with higher luminous efficiency.

In order to achieve the objectives above, the present disclosure mainly provides technical solutions as below.

In one aspect, embodiments of the present disclosure provide a light-emitting diode (LED), including:
  a grating layer; and
  a light reflecting layer; wherein
  a light-emitting component is disposed between the grating layer and the light reflecting layer; and
  the grating layer is configured to let linearly polarized light perpendicular to a grating direction of the grating layer in light emitted from the light-emitting component to transmit through the grating layer, and reflect linearly polarized light parallel to the grating direction of the grating layer in the light emitted from the light-emitting component.

Optionally, the above-mentioned light-emitting diode (LED) further includes:
  a depolarization layer located between the grating layer and the light reflecting layer.

Optionally, in the above-mentioned light-emitting diode (LED), the depolarization layer includes a quantum dot layer provided with quantum dots which emit excitation light when excited by the light emitted from the light-emitting component.

Optionally, in the above-mentioned light-emitting diode (LED), the quantum dot layer is provided with quantum dots having at least two colors; the quantum dots having at least two colors are mixed to be arranged in a same layer, or the quantum dots having different colors are arranged in different layers depending on the color.

Optionally, in the above-mentioned light-emitting diode (LED), the light-emitting component includes: a first type semiconductor layer, a second type semiconductor layer, and a light-emitting layer located between the first type semiconductor layer and the second type semiconductor layer;
  a first electrode layer is electrically connected to the first type semiconductor layer;
  the light reflecting layer includes a second electrode layer, the second electrode layer is an electrode layer prepared by using a light reflecting material;
  the grating layer, the quantum dot layer, the first type semiconductor layer, the light-emitting layer, the second type semiconductor layer and the reflective electrode layer are arranged sequentially; and
  the first electrode layer and the light-emitting layer are arranged in different regions at a same side of the first type semiconductor layer.

Optionally, in the above-mentioned light-emitting diode (LED), the first electrode layer is an electrode layer prepared by using a light reflecting material.

Optionally, in the above-mentioned light-emitting diode (LED), the first type semiconductor layer is a P type semiconductor, and the second type semiconductor layer is a N type semiconductor; or
  the first type semiconductor layer is a N type semiconductor, and the second type semiconductor layer is a P type semiconductor.

Optionally, in the above-mentioned light-emitting diode (LED), the light-emitting component is a blue light-emitting component, and the quantum dot layer is provided with red quantum dots and green quantum dots.

Optionally, in the above-mentioned light-emitting diode (LED), the grating layer is located at a first surface of a base substrate; and the light reflecting layer and the light-emitting component are located at a second surface opposite to the first surface of the base substrate.

Optionally, in the above-mentioned light-emitting diode (LED), the first surface of the base substrate is provided with a groove in which the grating layer is disposed; the grating layer has a height value which is smaller than or equal to a depth value of the groove.

Optionally, in the above-mentioned light-emitting diode (LED), the grating layer is made of a metallic material, having a line width ranged from 30-100 nm, a period ranged from 50-200 nm and a height ranged from 100-200 nm.

In another aspect, embodiments of the present disclosure provide a backlight module, including:
  a light-emitting diode (LED), including:
  a grating layer; and
  a light reflecting layer; wherein
  a light-emitting component is disposed between the grating layer and the light reflecting layer; and
  the grating layer is configured to let linearly polarized light perpendicular to a grating direction of the grating layer in light emitted from the light-emitting component to transmit through the grating layer, and reflect linearly polarized light parallel to the grating direction of the grating layer in the light emitted from the light-emitting component.

In yet another aspect, embodiments of the present disclosure provide a liquid crystal display (LCD) device, including a backlight module, the backlight module includes a light-emitting diode (LED), the LED includes:

a grating layer;

a light reflecting layer; wherein a light-emitting component is disposed between the grating layer and the light reflecting layer; and the grating layer is configured to let linearly polarized light perpendicular to a grating direction of the grating layer in light emitted from the light-emitting component to transmit through the grating layer, and reflect linearly polarized light parallel to the grating direction of the grating layer in the light emitted from the light-emitting component.

BRIEF DESCRIPTION OF THE DRAWINGS

Various other advantageous and benefits will be more apparent for those ordinary skilled in the art through reviewing the following detailed description of the exemplary embodiments. The accompanying drawings are provided for illustration of the exemplary embodiments, and are not intended to be interpreted as any limitation to the present disclosure. Furthermore, throughout the drawings, similar reference numerals indicate similar components. In the drawings.

DETAILED DESCRIPTION

Hereinafter, particular implementation(s), structure(s), feature(s) and technical effect(s) of the light-emitting diode (LED), the backlight module and the liquid crystal display (LCD) device provided according to the present disclosure will be described in more details with reference to the drawings and the preferred embodiments, in order to further explain the technical measures adopted for achieving predetermined objectives of the present disclosure as well as technical effects thereof. As used in the description below, wordings such as "an embodiment" or "the embodiment" appeared in various locations may not refer to a same embodiment. In addition, specific feature(s), structure(s) or characteristic(s) in one or more embodiments may be combined in any suitable manners.

The present embodiment provides a light-emitting diode (LED), in which a light reflecting layer can reflect the light reflected by a grating layer back to the grating layer again so that the TM linearly polarized light thereof is transmit through the grating layer, thereby improving the luminous efficiency of the LED for polarized light.

Figure 1:
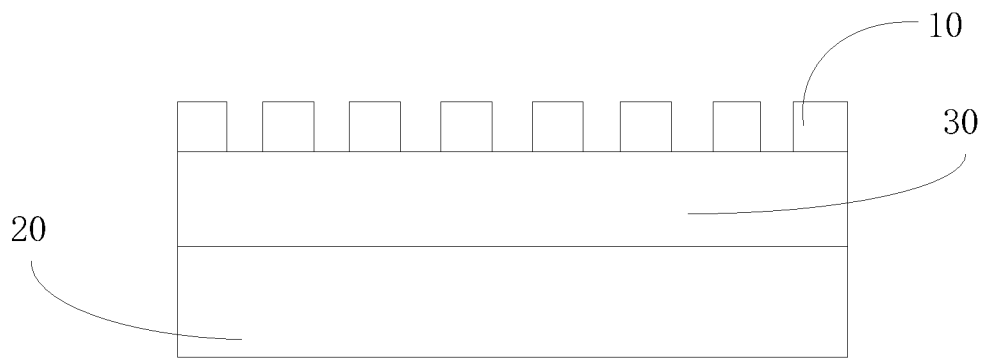
FIG. 1 is a schematically structural view of a light-emitting diode (LED) provided by some embodiments of the present disclosure.
Figure 2:
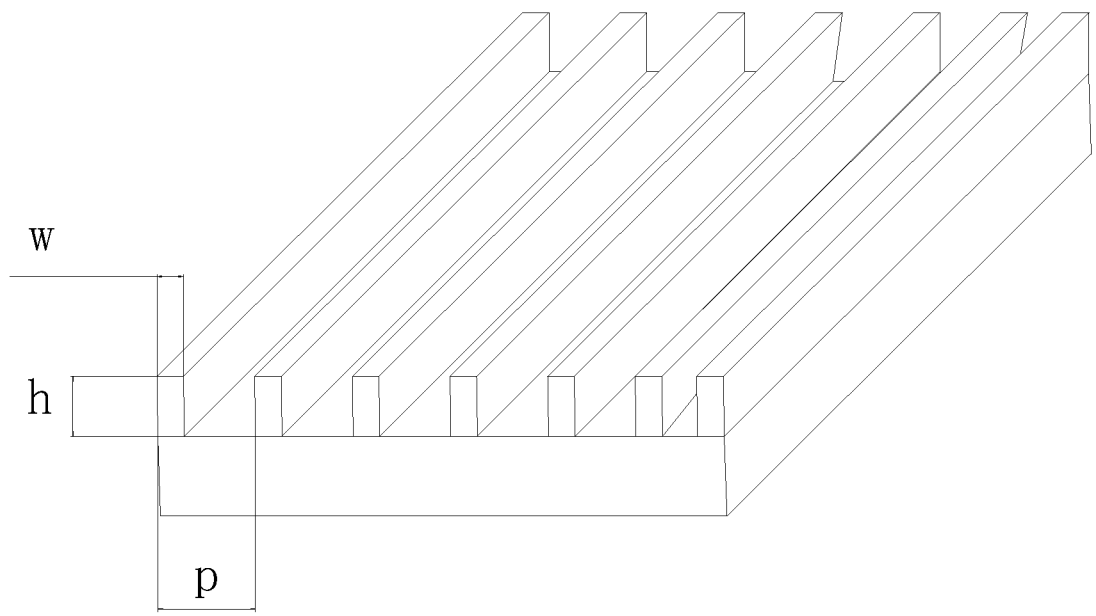
FIG. 2 is a schematically structural view of a grating in a light-emitting diode (LED) provided by some embodiments of the present disclosure.

FIGS. 1-2 illustrate an embodiment of the LED provided by the present disclosure. Referring to FIGS. 1-2, as illustrated in FIG. 1, an embodiment of the present disclosure provides a LED including a grating layer 10, a light reflecting layer 20 and a light-emitting component 30.

The light-emitting component 30 is disposed between the grating layer 10 and a reflecting surface of the light reflecting layer 20. The grating layer 10 may be a sub-wavelength grating; a period magnitude of the grating layer 10 is smaller than or equal to a wavelength magnitude of the light emitted from the light-emitting component; the grating layer 10 allows the TM linearly polarized light perpendicular to the grating direction of the grating layer 10 in the light emitted from the light-emitting component to transmit through the grating layer, and reflects the TE linearly polarized light parallel to the grating direction of the grating layer 10 in the light emitted from the light-emitting component.

Upon the light emitted from the light-emitting component arriving at the grating layer, the grating layer allows the TM linearly polarized light perpendicular to the grating direction of the grating layer to transmit through the grating layer, and reflects the TE linearly polarized light parallel to the grating direction of the grating layer. The light reflected by the grating layer may be reflected by the reflecting surface of the light reflecting layer and then arrive at the grating layer again, so that the TM linearly polarized light thereof will be transmitted through the grating layer, thereby improving the luminous efficiency of the LED for polarized light.

The grating layer may be a metallic grating made of a metallic material. It's possible to form a Nanopattern on a negative photoresist (PR) by using methods such as electron beam lithography and Nanoimprint lithography, and then to transfer the pattern by using dry etching technology so as to prepare the metallic grating. A material of the metallic grating may be any one selected from Al, Ag, Cu, Cr and Au, but not limited thereto. The metallic grating is a grating in which sub-wavelength metal wires are regularly arranged. Generally, the light-emitting component emits visible light having a wavelength ranged from 380-780 nm. In the present embodiment, as illustrated in FIG. 2, the metallic grating has a line width w ranged from 30-100 nm, a period p ranged from 50-200 nm, and a height h ranged from 100-200 nm. The metallic grating allows the TM linearly polarized light perpendicular to the grating direction of the metallic grating to transmit through the metallic grating, and reflects the TE linearly polarized light parallel to the grating direction of the metallic grating.

Figure 3:
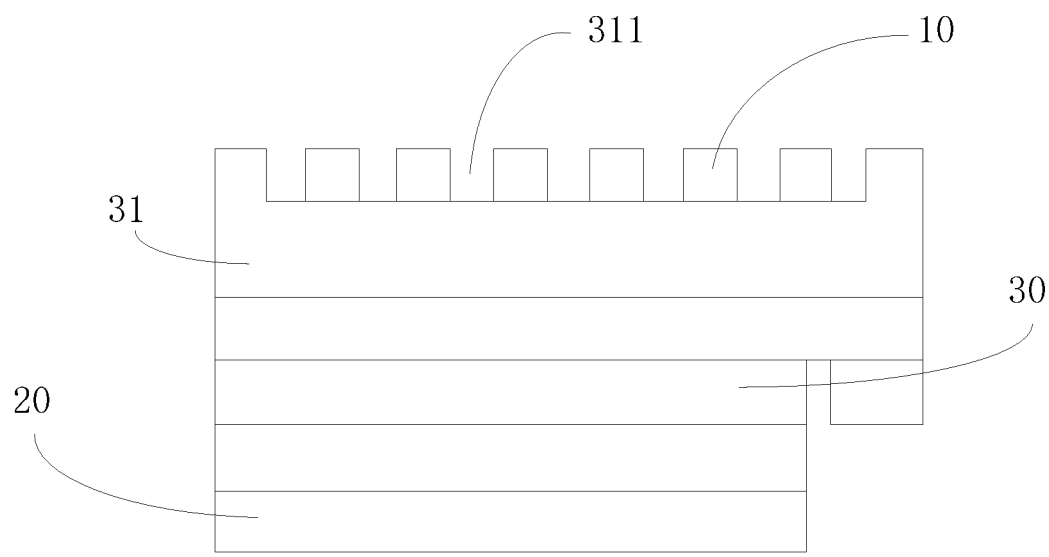
FIG. 3 is a schematically structural view illustrating particular details of a light-emitting diode (LED) provided by some embodiments of the present disclosure.

The light reflecting layer may be a reflecting layer prepared by using a material having a high light reflectivity. In some embodiments, as illustrated in FIG. 3, during practical manufacture, the grating layer 10 is located at a first surface of a base substrate 31, and the light reflecting layer 20 and the light-emitting component 30 are located at a second surface opposite to the first surface of the base substrate 31; the base substrate 31 usually is a sapphire substrate. The light reflecting layer may be an electrode layer prepared by using a conductive metallic material, for example, a reflective electrode made of Al, a reflective electrode made of Ag, and the like; one side of the light-emitting component that emits light is facing towards the grating layer; the light reflecting layer may be directly abutted against a semiconductor layer at the other side of the light-emitting component and electrically connected to the semiconductor layer, so as to be used as an electrode layer of the light-emitting component, which can simplify a structure of the LED and hence reduce a cost. When the grating layer is directly disposed at the base substrate, it may be directly manufactured at the first surface of the base substrate and protruded from the first surface; a transparent protective coating may be arranged on the grating layer to prevent the grating layer from being worn. As illustrated in FIG. 3, in some other embodiments, a groove 311 may be disposed at the first surface of the base substrate 31, and the grating layer 10 is disposed in the groove 311; a height value of the grating layer 10 is smaller than or equal to a depth value of the groove 311, that is, the grating layer is embedded within the groove, which also function to protect the grating.

In some other embodiments during practice, the light reflecting layer is not limited to the foregoing implementations, and may not be used as the electrode layer of the light-emitting component. The light reflecting layer may be prepared by using a non-metallic material or a metallic material. When the light reflecting layer is prepared by using a metallic material, a transparent base substrate may be disposed between the light reflecting layer and the light-emitting component. Usually, the base substrate may be a sapphire substrate.

The present embodiment provides a LED which further includes a depolarization layer, as compared to that provided by the foregoing embodiment. The depolarization layer may convert the TE linearly polarized light reflected by the grating layer into elliptically polarized light. The elliptically polarized light, upon passing through the light reflecting layer, will arrive at the grating layer again, and the TM linearly polarized light thereof will pass through the grating layer so that the illuminous efficiency of the LED for polarized light is relatively higher.

Figure 4:
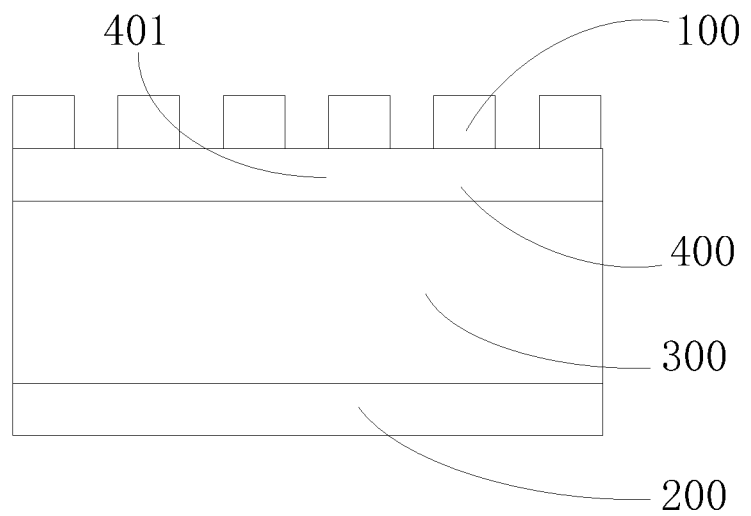
FIG. 4 is a schematically structural view illustrating particular details of a light-emitting diode (LED) provided by some embodiments of the present disclosure.

FIG. 4 illustrates an embodiment of the LED provided by the present disclosure. Referring to FIG. 4, an embodiment of the present disclosure provides a LED, including a grating layer 100, a light reflecting layer 200, a light-emitting component 300 and a depolarization layer 400; the light-emitting component 300 is located between the grating layer 100 and the light reflecting layer 200; the depolarization layer 400 is located between the grating layer 100 and the light reflecting layer 200.

The grating layer may be a sub-wavelength grating which has a period magnitude smaller than or equal to a wavelength magnitude of the light emitted from the light-emitting component. The grating layer may be configured to let the TM linearly polarized light perpendicular to the grating direction of the grating layer in the light emitted from the light-emitting component to transmit through the grating layer, and reflect the TE linearly polarized light parallel to the grating direction of the grating layer in the light emitted from the light-emitting component.

When the light that is emitted from the light-emitting component arrives at the grating layer, the TM linearly polarized light perpendicular to the grating direction of the grating layer may be transmitted through the grating layer, while the TE linearly polarized light parallel to the grating direction of the grating layer may be reflected by the grating layer. During the reflected TE linearly polarized light passing through the depolarization layer located in a light path again, it may be depolarized by the depolarization layer and converted into elliptically polarized light due to change of polarization state. In the elliptically polarized light that is reflected by the reflecting surface of the light reflecting layer and then arrives at the grating layer again, the TM linearly polarized light perpendicular to the grating direction of the grating layer may pass through the grating layer again so that the illuminous efficiency of the LED is relatively higher.

The depolarization layer may be an optically depolarization layer, e.g., quartz depolarization layer. In an embodiment of the present disclosure, as illustrated in FIG. 4, the depolarization layer includes a quantum dot layer 401. The quantum dot layer 401 may be located between the light-emitting component 300 and the grating layer 100. The quantum dot layer 401 is provided with quantum dots which emit excitation light upon being exited by the light emitted from the light-emitting component. In particular, a light path constituted by the quantum dot layer and the light-emitting component has a first light transmission surface facing towards the grating layer 100 and a second light transmission surface facing towards the reflecting surface of the light reflecting layer 200. The first light transmission surface and the second light transmission surface of the light path are optically conducted there-between.

When the light that is emitted from the light-emitting component arrives at the grating layer, the TM linearly linearly polarized light perpendicular to the grating direction of the grating layer may be transmitted through the grating layer, while the TE linearly polarized light parallel to the grating direction of the grating layer may be reflected by the grating layer. During the reflected TE linearly polarized light passing through the quantum dot layer located in the light path again, it may be depolarized by the quantum dot in the quantum dot layer and converted into elliptically polarized light due to change of polarization state. In the elliptically polarized light that is reflected by the reflecting surface of the light reflecting layer and then arrives at the grating layer again, the TM linearly polarized light perpendicular to the grating direction of the grating layer may pass through the grating layer again, so that the illuminous efficiency of the LED is relatively higher.

It should be explained that, in semiconductor materials, a micro-crystal is usually referred to as a quantum dot. Such quantum dot is capable of locking an electron in an extremely tiny three-dimensional space. When irradiated by the light emitted from the light-emitting component, the electron will be excited and transit to a higher energy level. These electrons, when returning back to the original lower energy level, emit light having a fixed wavelength. The quantum dots may have various colors and can generate light of various colors to be cooperated with colors of the light emitted from the light-emitting component, so that the LED generates light with a desired color. The quantum dots in the quantum dot layer may have a single color or multiple colors. In case that the quantum dot layer is provided with quantum dots having at least two colors, these quantum dots having at least two colors may be mixed and arranged in a same layer. A material of the quantum dot may be II-VI group semiconductor material such as CdSe and Cds; and a process of preparing the quantum dot may be a coating process such as spin-coating method and slit-coating method. Depending on the technical process, the quantum dots having different colors may also be arranged in different layers according to the colors; for example, the quantum dots having different colors may be laminated one on another, sequentially. The quantum dot layer may be arranged in various manners, with respect to the light-emitting layer. The embodiments of the present disclosure herein below only serve to explain the principle of the present disclosure by way of example, and the scope of the present disclosure is not limited thereto.

As illustrated in FIG. 4, as an example, the light-emitting component 300 may include a first type semiconductor layer (not illustrated), a second type semiconductor layer (not illustrated), and a light-emitting layer (not illustrated)

located between the first type semiconductor layer and the second type semiconductor layer. The light emitted from the light-emitting component 300 is divided into two branches; one of the branches directly passes through the quantum dot layer 401 and then has part of the polarized light thereof to be transmitted through the grating layer 100; and the other branch is reflected by the reflecting layer 200 and passes through the quantum dot layer 401, and then has part of the polarized light thereof to be transmitted through the grating layer 100. When the first type semiconductor is a P-type semiconductor, an electrode layer electrically connected to the first type semiconductor is a P-type electrode; correspondingly, the second type semiconductor is an N-type semiconductor, and an electrode layer electrically connected to the second type semiconductor is an N-type electrode. When the first type semiconductor is an N-type semiconductor, the electrode layer electrically connected to the first type semiconductor is an N-type electrode; correspondingly, the second type semiconductor is a P-type semiconductor, and the electrode layer electrically connected to the second type semiconductor is a P-type electrode. As an example, the LED may be a GaN based LED chip, the P-type semiconductor may be a P-GaN semiconductor layer, the N-type semiconductor layer may be an N-GaN semiconductor layer, and the light-emitting layer may be a multi-quantum well structure, but is not limited thereto.

Figure 5:
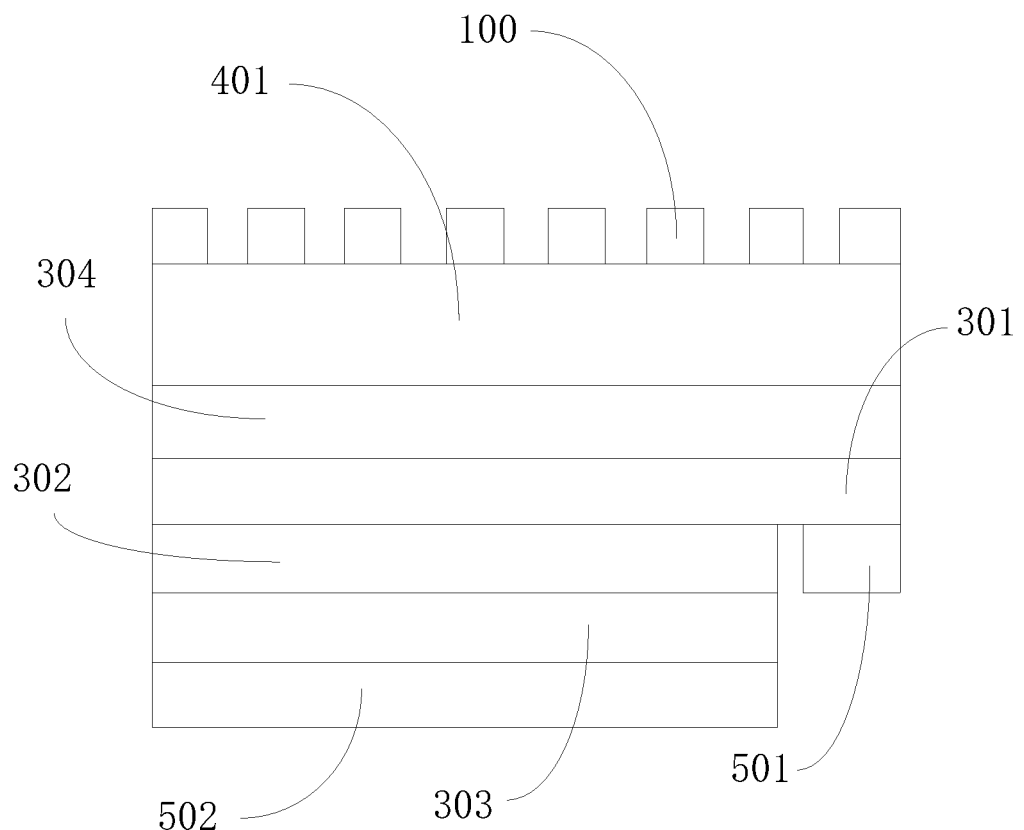
FIG. 5 is a schematically structural view of an inversed, light-emitting diode (LED) provided by some embodiments of the present disclosure.

During particular implementation, the LED may be manufactured into various types of basic device structure forms. FIG. 5 illustrates an embodiment of a LED with an inversed structure as provided by the present disclosure. Referring to FIG. 5, taking the LED with inversed structure as an example, the light-emitting component includes a first type semiconductor layer 301, a second type semiconductor layer 303, and a light-emitting layer 302 located between the first type semiconductor layer 301 and the second type semiconductor layer 303; a first electrode layer 501 is electrically connected to the first type semiconductor layer 301; a light reflecting layer includes a second electrode layer 502 which is a reflective electrode layer; a grating layer 100, a quantum dot layer 401, the first type semiconductor layer 301, the light-emitting layer 302, the second type semiconductor layer 303 and the reflective electrode layer are sequentially arranged; the first electrode layer 501 and the light-emitting layer 302 are arranged in different regions at a same side of the first type semiconductor layer 301.

When the first type semiconductor layer is an N-type semiconductor, the transparent electrode layer electrically connected to the first type semiconductor layer is correspondingly prepared by using an N-type transparent conductive material. When the first type semiconductor layer is a P-type semiconductor, the transparent electrode layer electrically connected to the first type semiconductor layer is correspondingly prepared by using a P-type transparent conductive material. The first electrode layer 501 is an electrode layer prepared by using a light reflecting material. The light reflected by the grating layer may be reflected to the quantum dot layer by the reflecting surface of the first electrode layer and then arrive at the grating layer, so as to improve the illuminous efficiency of the LED. In the LED having an inversed structure, the light emitted from the light-emitting component is transmitted to the quantum dot layer through the transparent substrate 304. Such LED with simpler structure and lower manufacturing cost is applicable for batch process.

In the device structure form provided by the foregoing embodiment, for purpose of achieving a LED emitting white polarized light, the light-emitting component may be a blue light-emitting component, and the quantum dot layer is provided with red quantum dots and green quantum dots, so that the blue light-emitting component emits blue light, the red quantum dots emit red light upon being excited by the blue light, and the green quantum dots emit green light upon being excited by the green light; the blue light, red light and green light will be mixed upon passing through the grating layer. In this way, a LED emitting white polarized light is achieved, and may be applicable in fields required for white polarized light. It should be appreciated that, by choosing light-emitting components having different colors to be cooperated with quantum dots having different colors, LEDs generating light with different colors may be obtained.

Figure 6:
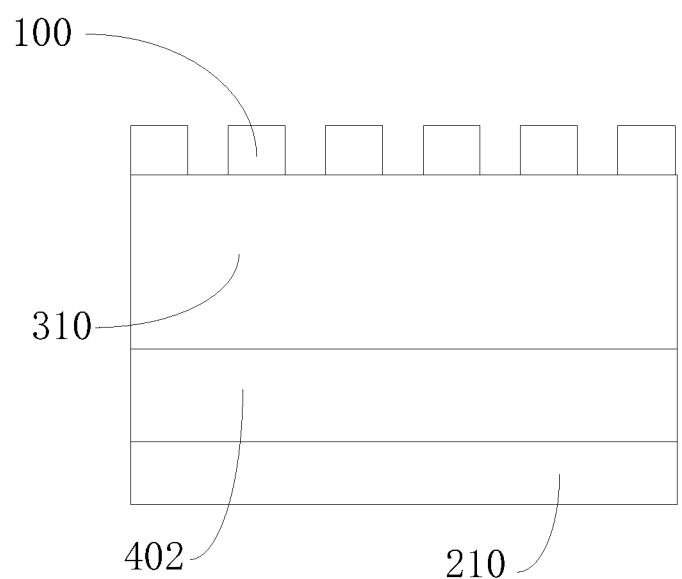
FIG. 6 is a schematically structural view illustrating particular details of another light-emitting diode (LED) provided by some embodiments of the present disclosure.

FIG. 6 is a schematically structural view of another specific LED provided by some other embodiments of the present disclosure. Unlike the quantum dot layer located between the light-emitting component and the grating layer described in the foregoing embodiment, as illustrated in FIG. 6, the quantum dot layer 402 is located between the light-emitting component 310 and the light reflecting layer 210; and the quantum dot layer 402 is provided with quantum dots which emit excitation light upon being excited by the light emitted from the light-emitting component 310. The light emitted from the light-emitting component 310 is divided into two branches; one of the branches directly passes through the grating layer 100; the other branch is transmitted through the grating layer upon passing through the quantum dot layer and being reflected by the reflecting layer. In this way, a relatively higher illuminous efficiency of polarized light is also obtained. The light-emitting component 301 may include: a first type semiconductor layer, a second type semiconductor layer, and a light-emitting layer located between the first type semiconductor layer and the second type semiconductor layer. Optionally, a first electrode layer electrically connected to the first type semiconductor layer and a second electrode layer electrically connected to the second type semiconductor layer both are transparent electrode layers. When the first type semiconductor is an N-type semiconductor, the transparent electrode layer electrically connected to the first type semiconductor is correspondingly prepared by using an N-type transparent conductive material, the second type semiconductor layer is a P-type semiconductor, and the transparent electrode layer electrically connected to the second type semiconductor is correspondingly prepared by using a P-type transparent conductive material. When the first type semiconductor layer is a P-type semiconductor, the transparent electrode layer electrically connected to the first type semiconductor is correspondingly prepared by using a P-type transparent conductive material, the second type semiconductor layer is an N-type semiconductor, and the transparent electrode layer electrically connected to the second type semiconductor is correspondingly prepared by using an N-type transparent conductive material.

The present embodiment provides a backlight module including a LED which adopts any of the LEDs described in the foregoing embodiments.

The LED may generate polarized light with relatively higher illuminous efficiency. The LED emits light towards a light guide plate, and may serve as a light source of the backlight module so that the backlight module provides a backlight source with relatively higher illuminous efficiency.

The present embodiment provides a liquid crystal display (LCD) device including a backlight module which adopts the backlight module described in the foregoing embodiment. The display device may be any product or component having display function, such as display panel, mobile phone, tablet computer, TV set, displayer, notebook computer, digital photo frame and navigator.

The backlight module is capable of generating polarized light with relatively higher illuminous efficiency, and hence can reduce a power consumption of the LCD device which adopts the backlight module as the backlight source.

By means of the technical solutions as above, the light-emitting diode (LED), the backlight module and the liquid crystal display (LCD) device provided by the technical solutions of the present disclosure at least possess advantageous as below.

In the technical solutions provided by the embodiments of the present disclosure, for the light that is emitted from the light-emitting component and then arrives at the grating layer, the grating layer lets TM linearly polarized light perpendicular to the grating direction of the grating layer to transmit through the grating layer, and reflects TE linearly polarized light parallel to the grating direction of the grating layer. The light reflected by the grating layer can arrive at the grating layer, again, upon being reflected by a reflecting surface of the light reflecting layer, so that the TM linearly polarized light can be transmitted through the grating layer, thereby achieving a relatively higher luminous efficiency of the light-emitting diode (LED) for polarized light.

The foregoing embodiments are respectively described with contents emphasized differently. As for portion(s) missing detailed explanation(s) in a certain embodiment, reference may be made to the related description in other embodiments.

It should be appreciated that, relevant features in the foregoing device may be referred to each other. In addition, as used in the foregoing embodiments, the terms "first" and "second" are merely for distinguishing different embodiments, without implying one is superior to the other.

Plenty of specific details are described in the description provided herein. However, it should be understood that, the embodiments of the present disclosure may be implemented without these specific details. In some examples, well-known structures and technologies are not illustrated in details so as not to obscure the understanding of the present Specification.

Similarly, it should be appreciated that, to simplify the present disclosure and facilitate understanding of one or more inventive aspect, in the foregoing description of the illustrative embodiments of the present disclosure, certain features of the present disclosure sometimes may be grouped into a single embodiment, a single figure or related description. However, the device(s) disclosed herein should not be interpreted in such a manner that it implies the present disclosure to be protected requires for more feature(s) than what is (are) definitely recorded in each of the claims. More specifically, as reflected in the appended claims, various aspects of the present disclosure require for less than all features in each and every embodiment disclosed above. Therefore, a claim following a particular embodiment is definitely incorporated into that particular embodiment, and each claim, per se, may be regarded as an individual embodiment of the present disclosure.

Those skilled in the art should be appreciated that, component(s) of a device in an embodiment may be self-adaptably varied and may be arranged in one or more device different from that in the embodiment. The components in the embodiment may be combined into a single component, or may be divided into a plurality of sub-components, instead. All the features and all the components in any device disclosed in the present specification (including the appended claims, the abstract and the drawings) may be combined in any manner, unless at least some of these features are mutually exclusive. Unless otherwise set forth definitely, each of the features disclosed in the present specification (including the appended claims, the abstract and the drawings) may be replaced by an alternative feature which provides identical, same or similar objective(s).

In addition, those skilled in the art should be appreciated that, although some of the embodiments set forth herein include some features included in other embodiment(s) instead of other features, a combination of the features from different embodiments should be interpreted as falling into the scope of the present disclosure and constitute different embodiments. For example, in the appended claims, any of the embodiments to be protected may be used in any combined manner. The components of the present disclosure may be implemented by hardware or a combination thereof.

It should be noted that, the foregoing embodiments are merely to describe the present disclosure rather than limiting, and those skilled in the art could design alternative embodiments without departing from the scope of the appended claims. In the claims, any reference mark between brackets should not be interpreted as a limitation to the claims. The word "an" or "a" used in front of a component or element doesn't exclude the existence of a plurality of such components or elements. The present disclosure may be implemented by means of a device including several different components. In the claims that enumerate several components, some of these components may be specifically implemented by a same item. Words such as "first" and "second" used herein do not indicate any sequence. These words may be interpreted as names.

The foregoing are merely preferred embodiments of the present disclosure without constituting a limitation to the present disclosure in any form. Any simple modification(s), identical change(s) and decoration(s) made to the foregoing embodiments according to the technical essence of the present disclosure shall also be fallen within the scope of technical solutions of the present disclosure.

What is claimed is:

1. A light-emitting diode (LED), comprising a light reflecting layer, a light-emitting component and a grating layer, wherein the light reflecting layer is arranged on a side of the light-emitting component away from the grating layer;
   wherein the light-emitting component is disposed between the grating layer and the light reflecting layer; and
   wherein the grating layer is configured to let linearly polarized light perpendicular to a grating direction of the grating layer in light emitted from the light-emitting component transmit through the grating layer, and to reflect linearly polarized light parallel to the grating direction of the grating layer in the light emitted from the light-emitting component, so that the linearly polarized light parallel to the grating direction of the grating layer is then reflected by the reflecting surface of the light reflecting layer and then arrives at the grating layer again;
   wherein the LED further comprises a depolarization layer located between the grating layer and the light reflecting layer;
   wherein the depolarization layer comprises a quantum dot layer provided with quantum dots which emit excitation light upon being excited by the light emitted from the light-emitting component;
   wherein:
   the light-emitting component comprises a first type semiconductor layer, a second type semiconductor layer, and a light-emitting layer located between the first type semiconductor layer and the second type semiconductor layer;
a first electrode layer is electrically connected to the first type semiconductor layer;
the light reflecting layer comprises a second electrode layer, the second electrode layer is a reflective electrode layer prepared by using a light reflecting material;
the grating layer, the quantum dot layer, the first type semiconductor layer, the light-emitting layer, the second type semiconductor layer and the reflective electrode layer are arranged sequentially; and
the first electrode layer and the light-emitting layer are arranged in different regions at a same side of the first type semiconductor layer.

2. The light-emitting diode (LED) according to claim 1, wherein the grating layer is a sub-wavelength metallic grating layer which has a period magnitude smaller than or equal to a wavelength magnitude of the light emitted from the light-emitting component.

3. The light-emitting diode (LED) according to claim 1, wherein
the quantum dot layer is provided with quantum dots having at least two colors, and
the quantum dots having at least two colors are mixed to be arranged in a same layer, or the quantum dots having different colors are arranged in different layers depending on the color.

4. The light-emitting diode (LED) according to claim 1, wherein
the light-emitting component comprises a first type semiconductor layer, a second type semiconductor layer, and a light-emitting layer located between the first type semiconductor layer and the second type semiconductor layer;
a first electrode layer is electrically connected to the first type semiconductor layer;
the light reflecting layer comprises a second electrode layer, the second electrode layer is a reflective electrode layer prepared by using a light reflecting material;
the grating layer, the first type semiconductor layer, the light-emitting layer, the second type semiconductor layer and the reflective electrode layer are arranged sequentially; and
the first electrode layer and the light-emitting layer are arranged in different regions at a same side of the first type semiconductor layer.

5. The light-emitting diode (LED) according to claim 4, wherein
the first type semiconductor layer is a P type semiconductor, and the second type semiconductor layer is a N type semiconductor; or
the first type semiconductor layer is a N type semiconductor, and the second type semiconductor layer is a P type semiconductor.

6. The light-emitting diode (LED) according to claim 1, wherein
the grating layer is located at a first surface of a base substrate, and
the light reflecting layer and the light-emitting component are located at a second surface opposite to the first surface of the base substrate.

7. The light-emitting diode (LED) according to claim 6, wherein
the first surface of the base substrate is provided with a groove, wherein the grating layer is disposed in the groove, and the grating layer has a height value which is smaller than or equal to a depth value of the groove.

8. The light-emitting diode (LED) according to claim 1, wherein
the grating layer is made of a metallic material, having a line width ranged from 30-100 nm, a period ranged from 50-200 nm and a height ranged from 100-200 nm.

9. A backlight module, comprising at least one light-emitting diode (LED), each of the at least one light-emitting diode comprising a light reflecting layer, a light-emitting component and a grating layer, wherein the light reflecting layer is arranged on a side of the light-emitting component away from the grating layer:
wherein the light-emitting component is disposed between the grating layer and the light reflecting layer; and
wherein the grating layer is configured to let linearly polarized light perpendicular to a grating direction of the grating layer in light emitted from the light-emitting component transmit through the grating layer, and to reflect linearly polarized light parallel to the grating direction of the grating layer in the light emitted from the light-emitting component, so that the linearly polarized light parallel to the grating direction of the grating layer is then reflected by the reflecting surface of the light reflecting layer and then arrives at the grating layer again;
wherein the LED further comprises a depolarization layer located between the grating layer and the light reflecting layer;
wherein the depolarization layer comprises a quantum dot layer provided with quantum dots which emit excitation light upon being excited by the light emitted from the light-emitting component;
wherein:
the light-emitting component comprises a first type semiconductor layer, a second type semiconductor layer, and a light-emitting layer located between the first type semiconductor layer and the second type semiconductor layer;
a first electrode layer is electrically connected to the first type semiconductor layer;
the light reflecting layer comprises a second electrode layer, the second electrode layer is a reflective electrode layer prepared by using a light reflecting material;
the grating layer, the quantum dot layer, the first type semiconductor layer, the light-emitting layer, the second type semiconductor layer and the reflective electrode layer are arranged sequentially; and
the first electrode layer and the light-emitting layer are arranged in different regions at a same side of the first type semiconductor layer.

10. A liquid crystal display (LCD) device, comprising a backlight module, wherein the backlight module comprises at least one light-emitting diode (LED), each of the at least one light-emitting diode comprising a light reflecting layer, a light-emitting component and a grating layer, wherein the light reflecting layer is arranged on a side of the light-emitting component away from the grating layer:
wherein the light-emitting component is disposed between the grating layer and the light reflecting layer; and
wherein the grating layer is configured to let linearly polarized light perpendicular to a grating direction of the grating layer in light emitted from the light-emitting component transmit through the grating layer, and to reflect linearly polarized light parallel to the grating direction of the grating layer in the light emitted from the light-emitting component, so that the linearly polarized light parallel to the grating direction of the grating layer is then reflected by the reflecting surface of the light reflecting layer and then arrives at the grating layer again;

wherein the LED further comprises a depolarization layer located between the grating layer and the light reflecting layer;

wherein the depolarization layer comprises a quantum dot layer provided with quantum dots which emit excitation light upon being excited by the light emitted from the light-emitting component;

wherein:

the light-emitting component comprises a first type semiconductor layer, a second type semiconductor layer, and a light-emitting layer located between the first type semiconductor layer and the second type semiconductor layer;

a first electrode layer is electrically connected to the first type semiconductor layer;

the light reflecting layer comprises a second electrode layer, the second electrode layer is a reflective electrode layer prepared by using a light reflecting material;

the grating layer, the quantum dot layer, the first type semiconductor layer, the light-emitting layer, the second type semiconductor layer and the reflective electrode layer are arranged sequentially; and the first electrode layer and the light-emitting layer are arranged in different regions at a same side of the first type semiconductor layer.

11. The liquid crystal display (LCD) device according to claim 10, wherein the grating layer is a sub-wavelength metallic grating layer which has a period magnitude smaller than or equal to a wavelength magnitude of the light emitted from the light-emitting component.

12. The liquid crystal display (LCD) device according to claim 10, wherein the quantum dot layer is provided with quantum dots having at least two colors, and the quantum dots having at least two colors are mixed to be arranged in a same layer, or the quantum dots having different colors are arranged in different layers depending on the color.

13. The liquid crystal display (LCD) device according to claim 10, wherein the first type semiconductor layer is a P type semiconductor, and the second type semiconductor layer is a N type semiconductor; or the first type semiconductor layer is a N type semiconductor, and the second type semiconductor layer is a P type semiconductor.

* * * * *